United States Patent [19]

Ashmore, Jr.

[11] Patent Number: 4,866,307
[45] Date of Patent: Sep. 12, 1989

[54] INTEGRATED PROGRAMMABLE BIT CIRCUIT USING SINGLE-LEVEL POLY CONSTRUCTION

[75] Inventor: Benjamin H. Ashmore, Jr., Houston, Tex.

[73] Assignee: Texas Instruments Incorporated, Dallas, Tex.

[21] Appl. No.: 183,956

[22] Filed: Apr. 20, 1988

[51] Int. Cl.[4] .................................. G11C 11/34
[52] U.S. Cl. .................... 307/469; 307/450; 307/451; 307/362; 307/530; 357/23.5; 365/184
[58] Field of Search ............ 307/448, 450, 451, 465, 307/468–469, 579, 585, 362, 530; 357/23.5, 42; 364/716; 365/184–185

[56] References Cited

U.S. PATENT DOCUMENTS 4,228,527 10/1980 Gerber et al. .................. 357/42 X
4,649,520 3/1987 Eitan .............................. 365/184 X Primary Examiner—David Hudspeth
Attorney, Agent, or Firm—Theodore D. Lindgren

[57] ABSTRACT

A zero-power bit circuit comprised in part of a pair of single-level poly transistors having opposite impurity-type channels, the pair connected to accomplish the programming function of a floating-gate transistor. The circuit includes sensing transistors for sensing the presence of absence of charge on the commonly connected gates of a transistor quadruplet comprised of the programming pair and sensing transistors. A diode-connected transistor, an isolation transistor and an inverter-buffer are also included in the bit circuit.

11 Claims, 1 Drawing Sheet

INTEGRATED PROGRAMMABLE BIT CIRCUIT USING SINGLE-LEVEL POLY CONSTRUCTION

This application is related to my U.S. patent application Ser. No. 07/183,957, entitled "Integrated Programmable Bit Circuit with Minimal Power Requirement", filed Apr. 20, 1988 and to my U.S. patent application Ser. No. 07/183,958, entitled "Single-Level Poly Programmable Bit Circuit", filed Apr. 20, 1988, both applications also assigned to Texas Instruments Incorporated.

BACKGROUND OF THE INVENTION

This invention relates to a bit circuit for use in programmable logic arrays formed on integrated-circuit chips and, in particular, to what is commonly known as a "zero power" bit circuit formed using complementary-metal-oxide-semiconductor (CMOS) processes.

Known previous attempts at constructing zero-power bit circuits in integrated form have utilized either cross-coupled inverters with stable states skewed by coupling capacitors to the power supplies or have utilized CMOS technology related to electrically-erasable-programmable-read-only-memory (EEPROM) devices. Bit circuits using cross-coupled inverters depend upon well-controlled power-up sequences for proper initialization of the circuit at the time the power source is connected and, if the bit setting is disturbed by unwanted transients occurring during operation, resetting of the bit will not occur until the next such power-up sequence is applied to the circuit. Bit circuits formed using EEPROM technology are generally limited to use in circuit designs that have EEPROM capability.

In my pending U.S. patent application Ser. No. 07/183,957, I have described a zero-power bit circuit that is compatible with existing CMOS technology and that requires no special power-up sequence of signals. One element of the bit-circuit embodiments described in that patent application is a transistor pair with common floating gates as described in abandoned U.S. patent application Ser. No. 065,989 by Howard L. Tigelaar, entitled "Floating Gate Semiconductor Device", filed June 24, 1987 and assigned to Texas Instruments Incorporated. The floating gate of the transistor pair used in the bit circuit of my pending U.S. patent application Ser. No. 183,957 requires additional steps or levels of processing during manufacture, as compared to the steps or levels of processing using transistors without such floating gates located between programming gates and channels.

Accordingly, there is a need for a zero-power bit circuit that requires no special power-up sequence of signals and that can be constructed using a single polysilicon gate level process. A bit circuit comprised solely of transistors with single-level polysilicon gates is particularly needed for construction of logic arrays that require relatively few programmable cells and that are otherwise comprised of circuitry that does not require the extra level of processing for fabrication of standard floating-gate transistors.

In my pending U.S. application Ser. No. 07,183,958, I have described a zero-power bit circuit that can be constructed solely of transistors with single-level polysilicon gates. The bit circuit of this invention is an alternative to the bit circuit described in that application.

SUMMARY OF THE INVENTION

The zero-power bit circuit of this invention requires no special power-up sequence of signals and can be constructed using single polysilicon gate transistors, thereby avoiding the cost and effort associated with floating-gate construction methods.

The bit circuit described and claimed herein utilizes a unique connection of a single-level polysilicon gate CMOS transistor pair comprised of a P-channel transistor and of an N-channel transistor to accomplish the function of a floating-gate transistor. An embodiment of the invention is described in which the bit circuit is comprised of a programmable quadruplet of transistors, diode-connected transistor, an isolation transistor and an output inverter-buffer. The programmable quadruplet of transistors includes the uniquely connected transistor pair with single-level gates connected to function as a floating-gate transistor.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE SPECIFIC EMBODIMENT

Figure 1:
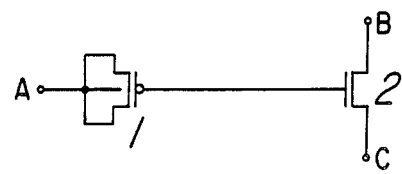
FIG. 1 is a circuit diagram of a CMOS single-level-gate transistor pair connected to perform the function of a floating-gate transistor.

Referring to FIG. 1, programmable transistor pair 1,2 is comprised of P-channel transistor 1 and of N-channel transistor 2. Programmable transistors 1 and 2 are constructed using conventional CMOS construction techniques and have single-level polysilicon gates. The source and drain connections of P-channel transistor 1 are connected to the channel tank of the same transistor 1 and to the node A programming terminal of transistor pair 1,2. The gates of programmable transistors 1 and 2 are connected to each other and are insulated from other circuitry that might cause electrons to enter or leave the gates. The source-drain path of N-channel transistor 2 is connected between nodes B and C.

For the purposes of programming, transistor pair 1,2 of FIG. 1 is preferably constructed by making, for example, the gate-to-channel capacitive area of P-channel transistor 1 much larger than the gate-to-channel capacitive area of N-channel transistor 2. The transistor pair 1,2 is programmed by applying a programming voltage Vpp to both nodes A and B while connecting node C to ground or other source of reference voltage Vss. With a larger gate-to-channel capacitance for transistor 1 than for transistor 2, a greater fraction of the applied programming voltage Vpp is applied across the gate to source-drain of transistor 2 than across the gate to source-drain of transistor With relatively high programming voltage Vpp applied, N-channel transistor 2 will avalanche in a manner similar to that of a floating-gate transistor and a negative charge will be trapped on the common control gates of transistors 1 and 2.

Programming of the transistor pair 1,2 of FIG. 1 is inhibited by connecting terminal a to ground or other source Vss of reference potential.

For purposes of reading or sensing, the source-drain path of transistor 2 will be nonconductive of the common gates of transistor pair 1,2 are charged or programmed and will be conductive if the common gates are uncharged or not programmed. In many applications, it is desirable to add a sensing means, such as one or more optional transistors, also having a common gate or gates with transistor 1 and 2. The source-drain path or paths of the added transistor or transistors may be used for sensing, leaving terminals A and B and transistor 2 for use solely during programming.

Figure 2:
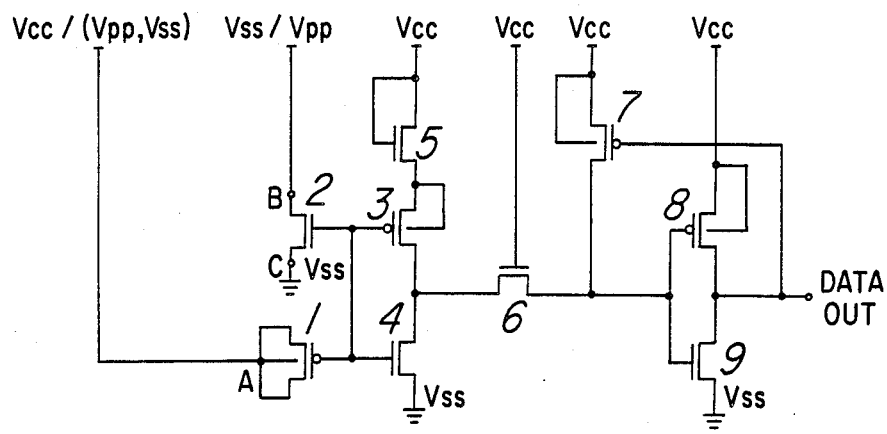
FIG. 2 is a circuit diagram of an embodiment of the zero-power bit circuit of this invention.

Referring to FIG. 2, programmable transistor pair 1,2 functions in the above-described manner similar to that of a floating-gate, avalanche-injection, metal-oxide-semiconductor (FAMOS) transistor. A high coupling of the programming voltage Vpp to the gate of transistor 2 is achieved by making the gate-to-channel capacitance or capacitive area of P-channel transistor 1 larger than the combined gate-to-channel capacitance or capacitive area of transistors 2, 3 and 4.

Sensing means 3,4,5 of the circuit of FIG. 2 is used to sense the presence of absence of a charge on the common gates of programmable transistor pair 1,2.

The gate of each of the sensing transistors 3 and 4 of FIG. 2 is connected to the common gates of programmable transistor pair 1,2. The source-drain paths of sensing transistors 3 and 4 are connected in series between the source-drain path of diode-connected biasing transistor 5 and ground or reference voltage source Vss. The source-drain path of P-channel sensing transistor 3 is connected nearest transistor 5 and the source-drain path of N-channel sensing transistor 4 is connected nearest ground or reference voltage Vss. The common source-drain terminal of transistors 3 and 4 is the output of transistor quadruplet 1-4 and is connected to the source-drain path of isolation transistor 6.

The other source-drain terminal and the gate of N-channel diode-connected transistor 5 are connected to a source Vcc of supply voltage. Diode-connected transistor 5 provides a voltage drop to the source of transistor 3, further improving the nonconductive biasing of transistor 3 during operation.

The other terminal of the source-drain path of N-channel isolation transistor is connected to the input of inverter-buffer means 7,8,9. The gate of isolation transistor 6 is connected to supply voltage source Vcc. Isolation transistor 6 prevents the full supply voltage source Vcc applied to transistor 7 from reaching the tank of transistor 3.

The source-drain path of feedback transistor 7 is connected between supply voltage source Vcc and the input of inverter-buffer means 7,8,9. The gate of transistor 7 is connected to the output DATA OUT of inverter-buffer means 7,8,9, which is the data output of the zero-power bit circuit of this invention during read or non-programming operation. Inverter 8,9 is comprised of P-channel transistor 8 with source-drain path in series with the source-drain path of N-channel transistor 9 between the supply voltage source Vcc and ground or reference potential Vss. The gates of transistors 8 and 9 are connected to the input of inverter-buffer 7,8,9 and the common source-drain terminal is connected to circuit output DATA OUT.

During programming of the circuit of FIG. 2, programming voltage supply Vpp is connected to nodes A and B, causing avalanche across the gate oxide layer of transistor 2 and resulting in negative charge on the common gates of transistors 1-4 similar to that on the floating gate of an erasable-programmable-read-only-memory (EPROM) cell.

During normal read operation of the circuit of FIG. 2, node B is connected to ground or other reference voltage source Vss and node A is connected to supply voltage source Vcc. If the bit circuit has not been programmed, transistor 4 will be conductive and transistor 3 will be nonconductive. Therefore, the voltage at the bit circuit output DATA OUT will be at potential Vcc. If the bit circuit has been programmed, transistor 4 will be nonconductive and transistor 3 will be conductive and the voltage at the DATA OUT terminal will be at ground or reference potential Vss.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope f the invention.

I claim:

1. A zero-power bit circuit comprising:
 a first-impurity-type-channel and a second-impurity-type channel programmable transistor pair having connected single-level gates and having source-drain paths connected to a source of supply voltage and a source of reference potential during read operation and connected to a source of programming voltage and a source of reference potential during programming operation,
 a sensing means connected to said gates of said programmable transistor pair to sense the programmed state of said transistor pair and to provide a signal in response said programmed state,
 an isolation transistor with a first source-drain path terminal connected to the output of said sensing means and with gate connected to said supply voltage source, and
 an inverter-buffer means connected to the second source-drain path terminal of said isolation transistor and with output comprising the output of said zero-power bit circuit.

2. The zero-power bit circuit of claim 1 in which the source, drain and tank of said first-impurity-type-channel transistor of said transistor pair are connected to said supply voltage source during read operation and to one of said programming voltage source and said source of reference potential during programming and in which the terminal of the source-drain path of said second-impurity-type-channel transistor of said transistor pair are both connected to said source of reference potential during read operation and are connected to said programming voltage source and to said source of reference potential during programming.

3. The zero-power bit circuit of claim 1 in which the gate-to-channel capacitance of said first-impurity-type-channel transistor of said transistor pair is greater than the gate-to-channel capacitance of said second-impurity-type-channel transistor of said transistor pair.

4. The zero-power bit circuit of claim 1 in which said sensing means is comprised of at least one field-effect transistor with gate connected to said gates of said programmable transistor pair and with source-drain path connected in a circuit between said supply voltage source and a source of reference potential.

5. The zero-power bit circuit of claim 1 in which said sensing means is comprised of:
- a diode-connected second-impurity-type-channel transistor with a first source-drain path terminal connected to said supply voltage source and with gate terminal connected to said supply voltage source;
- a first-impurity-type-channel sensing transistor with a first source-drain path terminal connected to a second source-drain path terminal of said diode-connected transistor and with gate terminal connected to said gates of said transistor pair; and
- a second-impurity-type-channel sensing transistor with a first source-drain path terminal connected to a second source-drain path terminal of said first-impurity-type-channel sensing transistor, with a second source-drain path terminal connected to said source of reference potential, and with gate terminal connected to said gates of said transistor pair.

6. The zero-power bit circuit of claim 1 in which said inverter-buffer means is comprised of an inverter with a first-impurity-type-channel feedback transistor with source-drain path connected between said supply voltage source and the input of said inverter and with gate terminal connected to the output of said inverter.

7. The zero-power bit circuit of claim 6 in which said inverter is comprised of a first-impurity-type-channel transistor and of a second-impurity-type-channel transistor with source-drain paths connected in series between said supply voltage source and said source of reference potential, with gates connected to said input of said inverter, and with common source-drain path terminal connected to the output of said inverter.

8. A zero-power bit circuit comprising:
- a first-impurity-type-channel programmable transistor with source, drain and tank connected to a supply voltage source during read operation and to one of a programming voltage source and a source of reference potential during programming operation,
- a second-impurity-type-channel programmable transistor with source and drain connected to said source of reference potential during read operation and with source-drain path connected between said programming voltage source and said source of reference potential during programming, and
- a sensing means connected to the connected gates of said programmable transistors.

9. The zero-power bit circuit of claim 8 in which said sensing means is comprised of:
- a diode-connected second-impurity-type-channel transistor with a first source-drain path terminal connected to said supply voltage source and with gate terminal connected to said supply voltage source;
- a first-impurity-type-channel sensing transistor with a first source-drain path terminal connected to a second source-drain path terminal of said diode-connected transistor and with gate connected to said gates of said programmable transistors; and
- a second-impurity-type-channel sensing transistor with a first source-drain path terminal connected to a second source-drain path terminal of said first-impurity-type-channel sensing transistor, with a second source-drain path terminal connected to said source of reference potential, and with gate terminal connected to said gates of said programmable transistors;
- wherein the output of said sensing means is the common source-drain terminal of said first-impurity-type-channel and second-impurity-type-channel sensing transistors.

10. The zero-power bit circuit of claim 8 in which the output of said sensing means is connected through an isolating transistor to an inverter-buffer means.

11. The zero-power bit circuit of claim 8 in which the gate-to-channel capacitance of said first-impurity-type-channel programmable transistor is greater than the gate-to-channel capacitance of said second-impurity-type-channel programmable transistor.

* * * * *